(12) United States Patent
Kye et al.

(10) Patent No.: US 6,288,931 B1
(45) Date of Patent: Sep. 11, 2001

(54) FERROELECTRIC MEMORY DEVICE HAVING CELL GROUPS CONTAINING CAPACITORS COMMONLY COUPLED TO TRANSISTOR

(75) Inventors: Hun-Woo Kye; Nam-Soo Kang, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/604,556

(22) Filed: Jun. 27, 2000

(30) Foreign Application Priority Data

Jun. 28, 1999 (KR) .................................................. 99-25016

(51) Int. Cl.$^7$ .................................................... G11C 11/22
(52) U.S. Cl. ........................... 365/145; 365/149; 365/203
(58) Field of Search ..................................... 365/145, 149, 365/150, 203

(56) References Cited

U.S. PATENT DOCUMENTS

| 5,038,323 | 8/1991 | Schwee | 365/145 |
|---|---|---|---|
| 5,424,975 | 6/1995 | Lowrey et al. | 365/145 |
| 5,600,587 | 2/1997 | Koike et al. | 365/145 |
| 5,615,145 | * 3/1997 | Takeuchi et al. | 365/145 |
| 5,629,888 | * 5/1997 | Saito et al. | 365/145 |
| 5,907,170 | 5/1999 | Forbes et al. | 257/296 |
| 5,914,511 | 6/1999 | Noble et al. | 257/302 |
| 5,978,250 | 11/1999 | Chung et al. | 365/145 |
| 6,025,225 | 2/2000 | Forbes et al. | 438/243 |
| 6,031,754 | 2/2000 | Derbenwick et al. | 365/145 |
| 6,046,929 | * 4/2000 | Aoki et al. | 365/145 |
| 6,094,371 | * 7/2000 | Fukuda | 365/145 |

FOREIGN PATENT DOCUMENTS

| 3-256358 | 11/1991 | (JP) | H01L/27/108 |
|---|---|---|---|
| 08203266 | 8/1996 | (JP) | G11C/11/22 |
| 08212771 | 8/1996 | (JP) | G11C/11/22 |
| 08329686 | 12/1996 | (JP) | G11C/14/00 |
| 10011976 | 1/1998 | (JP) | G11C/14/00 |
| 10135417 | 5/1998 | (JP) | H01L/27/10 |
| 10255484 | 9/1998 | (JP) | G11C/14/00 |
| 11238387 | 8/1999 | (JP) | G11C/14/00 |

* cited by examiner

Primary Examiner—Tan T. Nguyen
(74) Attorney, Agent, or Firm—Jacobson Holman, PLLC

(57) ABSTRACT

A ferroelectric memory device includes: a plurality of cell groups, wherein each cell group includes a transistor and at least two ferroelectric capacitors commonly coupled to the transistor; at least one word line for selecting the cell groups; at least two plate lines for driving the capacitors contained in a memory cell of a selected cell group; and at least one bit line for transmitting data to the selected memory cell. Therefore, the integrity of device is increased by coupling at least two memory cells to one bit line and one word line through one transistor.

7 Claims, 8 Drawing Sheets

US 6,288,931 B1

FERROELECTRIC MEMORY DEVICE HAVING CELL GROUPS CONTAINING CAPACITORS COMMONLY COUPLED TO TRANSISTOR

FIELD OF THE INVENTION

The present invention relates to a semiconductor memory device; and, more particularly, to a ferroelectric memory device including a plurality of cell groups, each cell group having a transistor and a plurality of ferroelectric capacitors commonly coupled to the transistor.

DESCRIPTION OF THE PRIOR ART

A memory cell of a conventional ferroelectric random access memory (FeRAM) includes one transistor and one ferroelectric capacitor. It is well known that a ferroelectric capacitor shows a hysteresis characteristic between the charge and the voltage applied to the two terminals of the ferroelectric capacitor.

FIG. 1A shows a symbol of a ferroelectric capacitor with the two terminals, and FIG. 1B shows a hysteresis characteristic of a ferroelectric capacitor.

A characteristic of a ferroelectric capacitor will be described with reference to FIGS. 1A and 1B. An amount of charge stored in the ferroelectric capacitor varies according to a polarization state S1 or S2 even if the voltage difference between the two terminals is zero. Thus, binary logic data can be stored in the ferroelectric capacitor even in the absence of power supply. The ferroelectric capacitor differs from the linear capacitor on that point. The polarization states are varied with the voltage applied to the two terminals of the ferroelectric capacitor, so that the amount of charge stored in the ferroelectric capacitor is varied.

As shown in FIG. 1B, the polarization state of the ferroelectric capacitor is changed from the state S1 to a state S3 by a large negative voltage applied thereto. And the polarization sate is changed from the state S3 to the state S2 when the voltage difference between the two thermals is zero. As described above, the amount of the charge is varied with the applied voltage, so that the ferroelectric capacitor can be used as a storage element of a non-volatile memory device.

FIG. 1C is a waveform showing a potential change 10 of a bit line caused by the charge sharing between a ferroelectric capacitor Cf and a bit line parasitic capacitor Cb in case where a voltage is applied to a plate line PL.

In FIG. 1C, reference symbols V1 and V0 denote a potential of a bit line when data "1" and "0" are stored in the ferroelectric capacitor Cf, respectively.

FIG. 2 is a circuit diagram illustrating an array 100 of conventional FeRAM memory cells, each of the memory cells having a folded bit line architecture. For example, a memory cell 20 for storing 1 bit of conventional FeRAM includes one NMOS transistor N21 and one ferroelectric capacitor C21. A gate of the NMOS transistor N21 is coupled to a word line WL0, a drain of the NMOS transistor N21 is coupled to a bit line Bit0 and the other a source of the NMOS transistor N21 is coupled to the ferroelectric capacitor C21. Two electrodes of the ferroelectric capacitor C21 are coupled to the NMOS transistor N21 and a cell plate line PL0, respectively.

First electrodes of each ferroelectric capacitor C21 to C28 are coupled to NMOS transistors N21 to N28, respectively, and second electrodes of each ferroelectric capacitor C21 to C28 is commonly coupled to the plate line PL0. The word lines WL0 to WL3 are perpendicular to the bit lines Bit0 to Bitb3 and parallel to the plate lines PL0 and PL1.

A predetermined voltage must be applied to the two electrodes of the ferroelectric capacitors during a reading or a writing operation. Therefore, a high state voltage Vcc or a low state voltage Vss is applied to the plate line PL0.

The read operation of the conventional FeRAM device will be described in detail with reference to FIGS. 1B and 2.

In order to read data stored in the ferroelectric capacitor C21, the word line WL0 is selected and activated, and the rest word lines WL1, WL2 and WL3 are remained as inactivated. A high level signal is applied to the plate line PLS0 coupled to the gate of an NMOS transistor N20. A low signal is applied to the global plate line GPL coupled to the NMOS transistor N20 through an inverter INV20. As a result, the high level signal is applied to the plate line PL0.

As described above, the bit line BitO and the storage node S1 are precharged to the ground level, so that the voltage between the two terminals of the ferroelectric capacitor C21 becomes −Vcc.

Referring to FIG. 1B, the polarization state of ferroelectric capacitor is changed from state S1 or S2 to the direction of S3, when a negative voltage is applied to the ferroelectric capacitor C21. Therefore, the voltage of the bit line Bit0 is changed according to the variation of the charge amount ΔQ1 or ΔQ1.

As a result, the capacitance of the parasitic bit line capacitor Cb is changed. That is, data is transferred between the parasitic bit line capacitor Cb and the ferroelectric capacitor C21 by a charge sharing.

In FIG. 1B, S1 and S2 denote logic data "1" and "0", respectively. The polarization state S1 is changed to the state corresponding to the voltage V1, and the polarization state S2 is changed to a state corresponding to the voltage V0, when a large negative voltage is applied to the ferroelectric capacitor C21. The capacitance obtained by the change of the polarization state S1 to the direction of the polarization state S3 is larger than the capacitance obtained by the change the polarization state S2 to the direction of the polarization state S3. Therefore, the voltage V1 is lager than the voltage V0. This relation is expressed by the following equation:

$$\Delta V1 = \frac{Cf1}{Cf1 + Cb} \times \Delta Vp, \Delta V0 = \frac{Cf0}{Cf0 + Cb} \times \Delta Vp \qquad \text{(Eq. 1)}$$

where, $\Delta Vp$ represents the amount of voltage variation of plate line, and $Cf1$ and $Cf0$ represents the equivalent capacitance of data logic "1" and "0" states, respectively.

In Eq. 1, the $\Delta V1$ is larger than the $\Delta V0$ since the $Cf1$ is larger than the $Cf0$.

As described above, the memory cell of the conventional FeRAM includes one switching NMOS transistor and one ferroelectric capacitor. In order to drive a memory cell, a plurality of bit lines, word lines and plate lines coupled to each memory cell are driven, respectively. Therefore, the conventional FeRAM has the limitation in the improvement of the device integration.

SUMMARY OF THE INVENTION

It is an object of the present invention is to provide a ferroelectric memory device capable of increasing the integrity of device by coupling at least two memory cells to one bit line and one word line through one transistor.

In accordance with one aspect of the present invention, there is provided a ferroelectric memory device comprising:

a plurality of cell groups, wherein each cell group includes a transistor and at least two ferroelectric capacitors commonly coupled to the transistor; at least one word line for selecting the cell groups; at least two plate lines for driving the capacitors contained in a memory cell of a selected cell group; and at least one bit line for transmitting data to the selected memory cell.

In accordance with another aspect of the present, there is provided a ferroelectric memory device comprising: a plurality of memory cells, wherein each memory cell includes a ferroelectric capacitor for storing data; a reference voltage generating means for generating a reference voltage; a sense amplifying means for sensing and amplifying signals outputted from the memory cell; a precharging means; a plurality of bit line pairs precharged by the precharging means, wherein each bit line pair includes a first bit line for transmitting data from the memory cell to the sense amplifying means and the second bit line for transmitting the reference voltage to the sense amplifying means; a plurality of cell groups, wherein each cell group includes a plurality of memory cells which are commonly coupled to the same word line and the same bit line pair through one transistor; and a plurality of plate lines for respectively driving the ferroelectric capacitors contained in each memory cell of the same cell group.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 3:
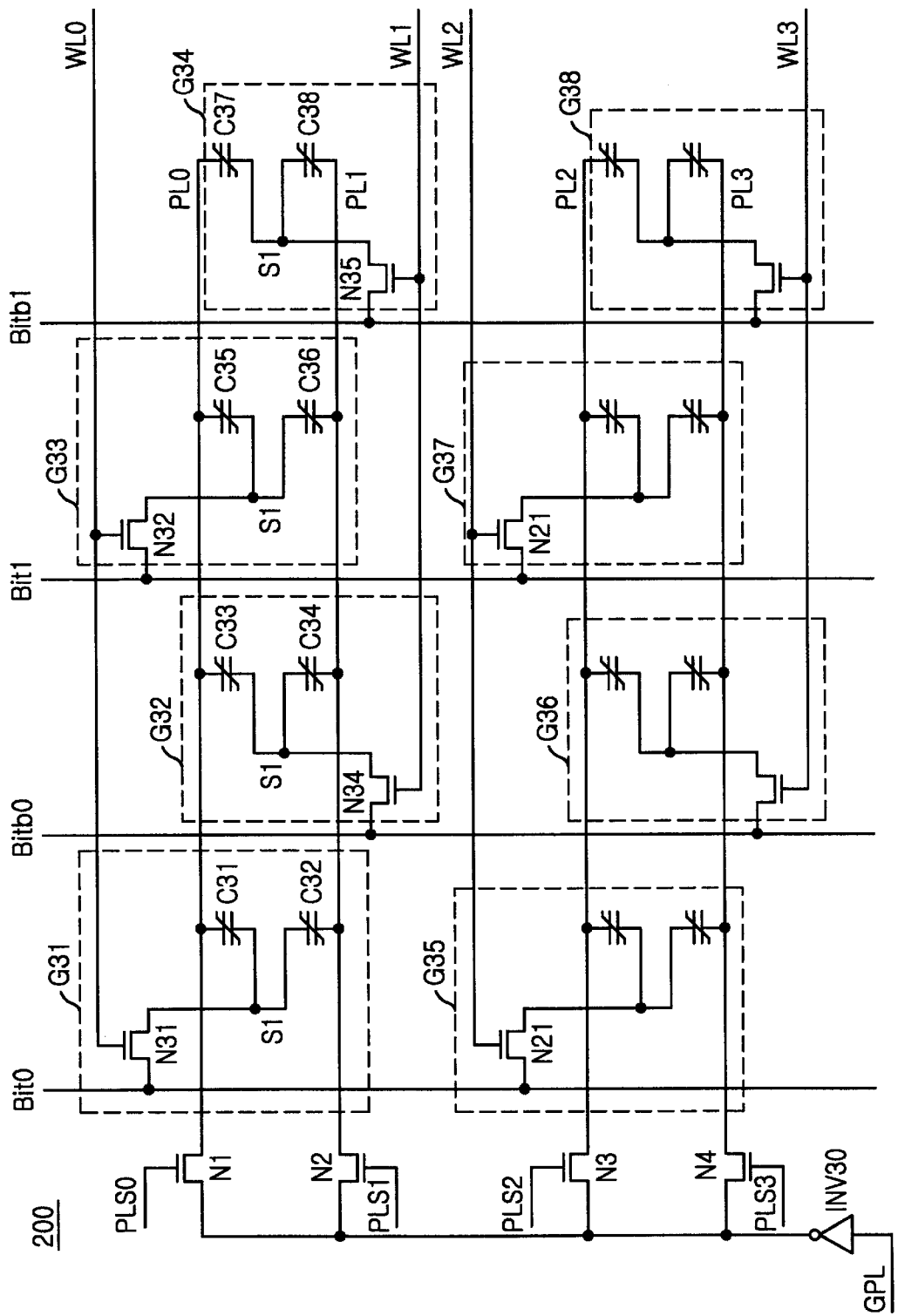
FIG. 3 depicts a circuit diagram illustrating an array of ferroelectric memory cell in accordance with a preferred embodiment of the present invention.

Referring to FIG. 3, a ferroelectric random access memory (FeRAM) 200 according to an embodiment of the present invention comprises a plurality of cell groups G31 to G38 including two adjacent memory cells coupled to the same bit line and the same word line. Each memory cell in the same cell group includes a ferroelectric capacitor commonly coupled the same NMOS transistor and respectively driven by different plate lines.

For example, a cell group G31 includes two memory cells commonly coupled to the same bit line Bit0 and the same word line WL0. Each ferroelectric capacitor C31 and C32 in the two memory cells of the cell group G31 is coupled to the same NMOS transistor N31 and different plate lines PL0 and PL1, respectively.

A gate of the NMOS transistor N31 is coupled to a word line WL0. One source/drain junction of the NMOS transistor N31 is coupled to a bit line Bit0 and the other source/drain junction of the NMOS transistor N31 is coupled to the ferroelectric capacitors C31 and C32. Each first electrode of the ferroelectric capacitors C31 and C32 is coupled to the NMOS transistor N31, and each second electrode of the ferroelectric capacitors C31 and C32 is coupled to the different plate lines PL0 and PL1, respectively.

The word lines WL0 to WL3 are perpendicular to the bit lines Bit0 to Bitb3 and parallel to the plate lines PL0 to PL3. Each plate line is commonly coupled to ferroelectric capacitors in the different cell groups.

Figure 1A:
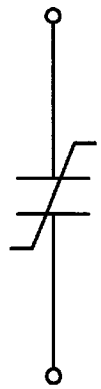
FIG. 1A presents a symbol of a conventional ferroelectric capacitor.
Figure 1B:
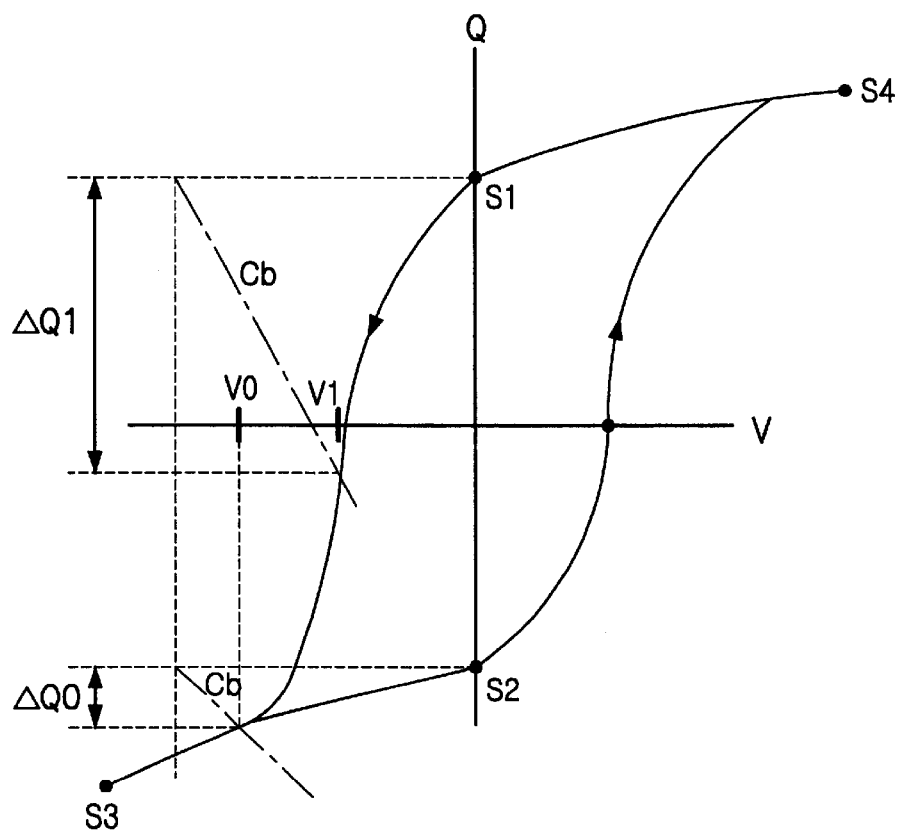
FIG. 1B is a graph illustrating the hysteresis characteristic of a conventional ferroelectric capacitor.
Figure 1C:
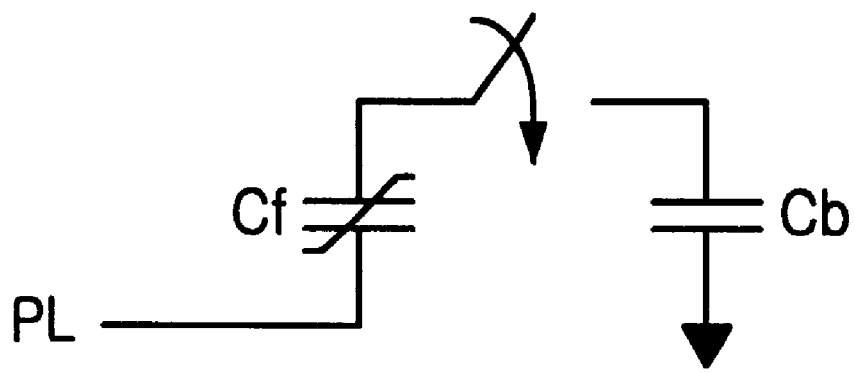
FIG. 1C is a schematic circuit diagram illustrating the voltage variation of bit line when a voltage is applied to the plate line and the charge sharing is generated between ferroelectric capacitor and bit line parasitic capacitance.
Figure 1C:
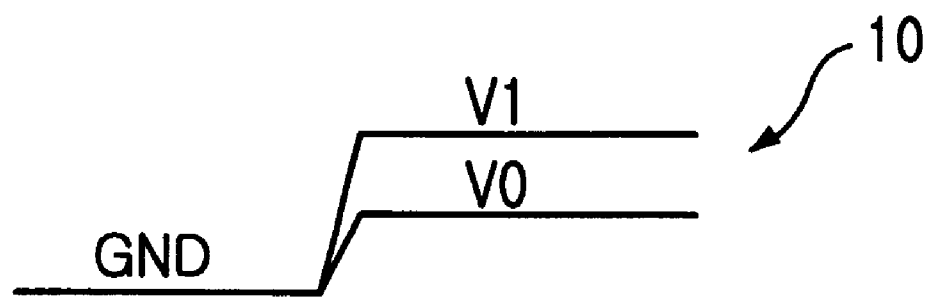
Figure 2:
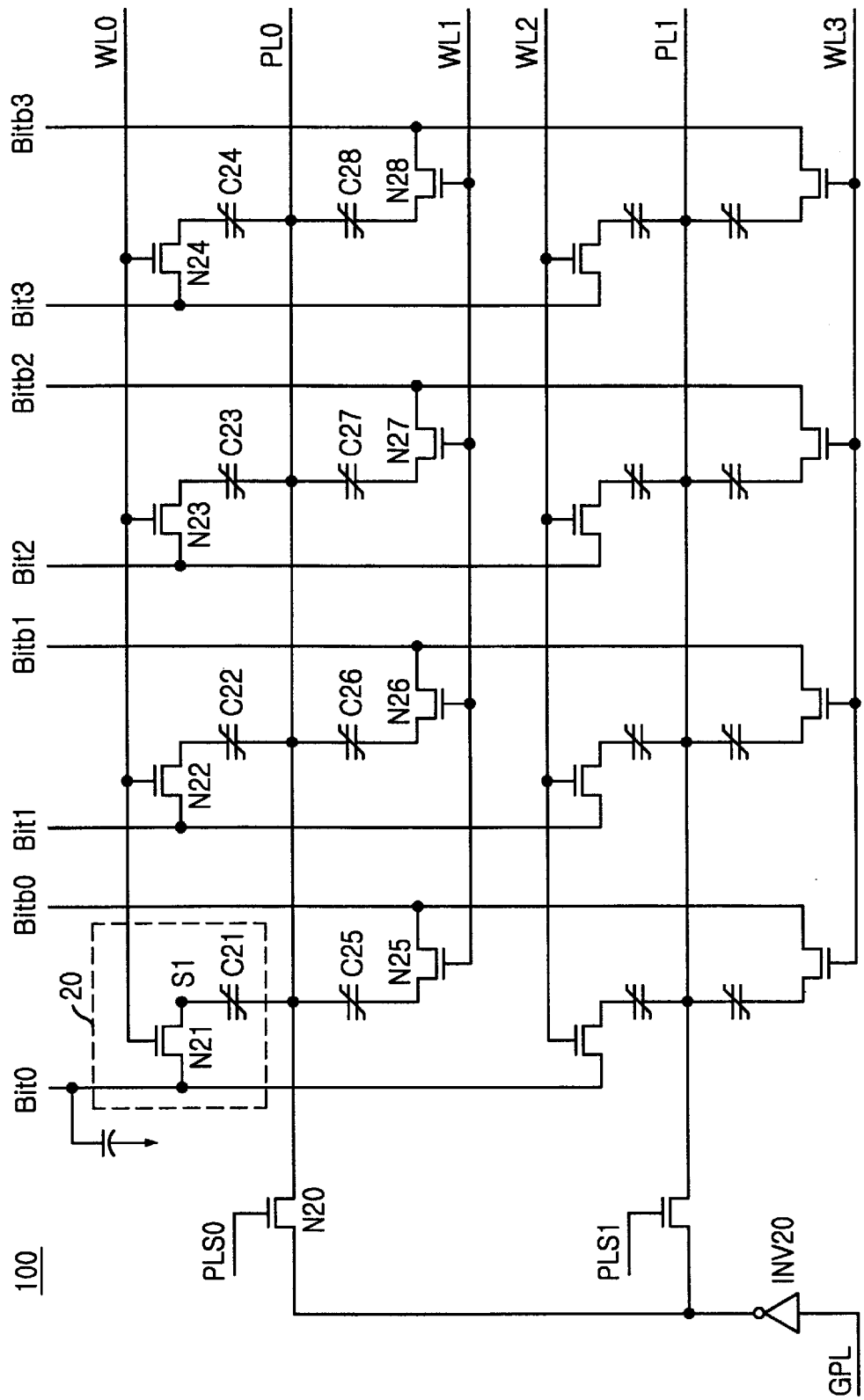
FIG. 2 shows a circuit diagram illustrating conventional cell array of a ferroelectric memory device having folded bit line architecture.

The conventional FeRAM device shown in FIG. 2 needs eight switching NMOS transistors, eight bit lines, two word lines and one plate line for eight memory cells. The FeRAM according to present invention shown in FIG. 3 only needs four switching NMOS transistors, four bit lines, two word lines and two plate lines for eight memory cells. Therefore, the physical size of the FeRAM device according to the present invention is smaller than that of the conventional FeRAM device.

The read operation of the FeRAM device having memory cells according to the present invention will be described in detail with reference to FIG. 3.

In order to read data stored in the ferroelectric capacitor C31 in the cell group G31, the word line WL0 coupled to the NMOS transistor N31 is selected and activated, and the rest word lines WL1 to WL3 are remained as inactivated. A high level signal is applied to the plate line PLS0 coupled to the gate of the NMOS transistor N1. Additionally, low signal is applied to the global plate line GPL coupled to the NMOS transistor N1 through an inverter INV30. Then, the high level signal, Vcc, is applied to the plate line PL0. Therefore, the voltage of the bit line Bit0 is changed according to the variation of the polarization state of the ferroelectric capacitor C31 and the logic data "1" or "0" stored in the ferroelectric capacitor C31 can be transmitted to the bit line Bit0. The data transmitted to the bit line Bit0 can be read out by the sensing and amplifying operation.

In order to read data stored from one ferroelectric capacitor C32 in the cell group G31, the word line WL0 coupled to the NMOS transistor N31 is selected and activated, and the rest word lines WL1 to WL3 are remained as inactivated. A high level signal is applied to the plate line PLS1 connected to the gate of the NMOS transistor N2. A low signal is applied to the global plate line GPL coupled to the NMOS transistor N2 through an inverter INV30. Then, the high level signal, Vcc, is applied to the plate line PL1. Therefore, the voltage of the bit line Bit0 is changed according to the variation of the polarization state of the ferroelectric capacitor C32 and the logic data "1" or "0" stored in the ferroelectric capacitor C32 can be transmitted to the bit line Bit 0.

Figure 4A:
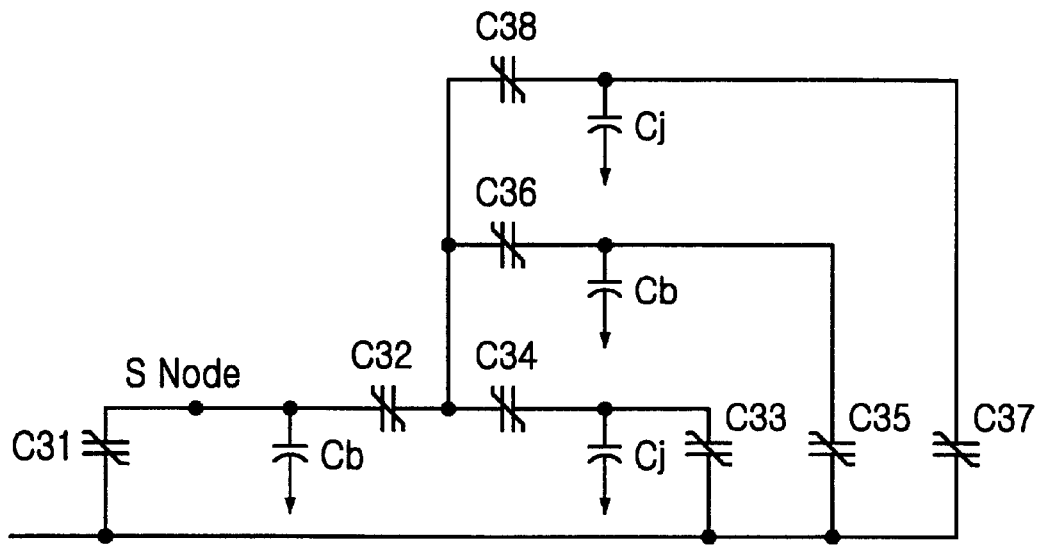
FIGS. 4A and 4B are schematic circuit diagrams illustrating a charge sharing relation between a ferroelectric capacitor and a parasitic capacitor at reading operation.
Figure 4B:
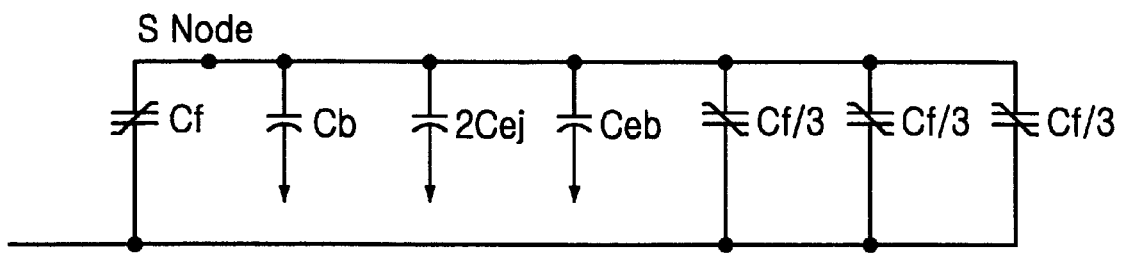

FIGS. 4A and 4B are schematic diagrams illustrating a charge sharing relation between a ferroelectric capacitor and a parasitic capacitor during reading operation.

Referring to FIGS. 3 and 4A, it is assumed that the word line WL0 and the plate line PL0 are selected to read out data stored in the ferroelectric capacitor C31 coupled to the bit line capacitor Cb through a switching NMOS transistor N31. The ferroelectric capacitor C31 is also coupled to the two ferroelectric capacitors C32 and C34 in series and a parasitic junction capacitance Cj of a switching NMOS transistor N34. The ferroelectric capacitor C31 is also coupled to a ferroelectric capacitor C33 through the two ferroelectric capacitors C32 and C34. FIG. 4A is an equivalent circuit of all capacitors coupled to the ferroelectric capacitors C31. In FIG. 4A, the voltage of storage node S1 varying with the voltage of the plate line PL0 is equal to the voltage induced to the bit line Bit0. FIG. 4B is an equivalent circuit of FIG. 4A.

In FIGS. 4A and 4B, Cf, Cb, and Cj denote an equivalent capacitance of ferroelectric capacitors, a parasitic capacitance of bit lines, and a parasitic junction capacitance of NMOS transistor at a turn-off state, respectively. One capacitance Cej is caused by the two ferroelectric capacitors C32 and C34 coupled in series and the parasitic junction capacitance Cj of the NMOS transistor N34 at a turn-off state. The other capacitance Cej is also caused by the two ferroelectric capacitors C32 and C34 and the parasitic junction capacitance Cj of the NMOS transistor N35 at turn-off state.

When it is assumed that each capacitance of the two ferroelectric capacitors C32 and C34 is equal to the capacitance Cf, the capacitance Cej is expressed by the following equation.

$$Cef = \frac{1}{\frac{1}{Cf} + \frac{1}{Cf} + \frac{1}{Cj}} \cong Cj \quad \text{(Eq. 2)}$$

where, Cf>>Cj

In Eq. 2, the capacitance Cf amounts to hundreds of femto-farad and the capacitance Cj amounts to several femto-farad, therefore the capacitance Cej is approximately equal to the Cj.

In FIG. 4B, Ceb denotes the equivalent capacitance between the two ferroelectric capacitors C32 and C36 and the parasitic capacitance Cb of the bit line coupled in series as shown in FIG. 4A. The Ceb can be expressed by the following equation.

$$Ceb = \frac{1}{\frac{1}{Cf} + \frac{1}{Cf} + \frac{1}{Cb}} \cong Cj \quad \text{(Eq. 3)}$$

where, Cb>>Cj.

In Eq. 3, the capacitance Cb amounts to hundreds of femto-farad and assuming that the capacitance Cb is larger than the capacitance Cf, then the capacitance Ceb is approximately equal to the capacitance Cf.

The equivalent capacitance of ferroelectric capacitors C32, C34 and C33 coupled in series is Cf/3, the equivalent capacitance of the ferroelectric capacitors C32, C36 and C35 coupled in series is also Cf/3, and the equivalent capacitance of the ferroelectric capacitors C32, C38 and C37 coupled in series is also Cf/3. Therefore, FIG. 4A can be schematically represented as FIG. 4B.

In FIG. 4B, the amount of voltage variation $\Delta V_s$ of storage node S1 according to the amount of voltage variation $\Delta V_p$ of plate line can be expressed by the following equation.

$$\Delta V_s = \frac{Cf + \frac{Cf}{3} \times 3}{Cf + Cb + Cf} \times \Delta V_p = \frac{2Cf}{2Cf + Cb} \times \Delta V_p \quad \text{(Eq. 4)}$$

Therefore, when the plate line is driven for the reading operation in the FeRAM device shown in FIG. 3, the voltage induced to the bit line can be obtained by the equation 3.

Figure 5:
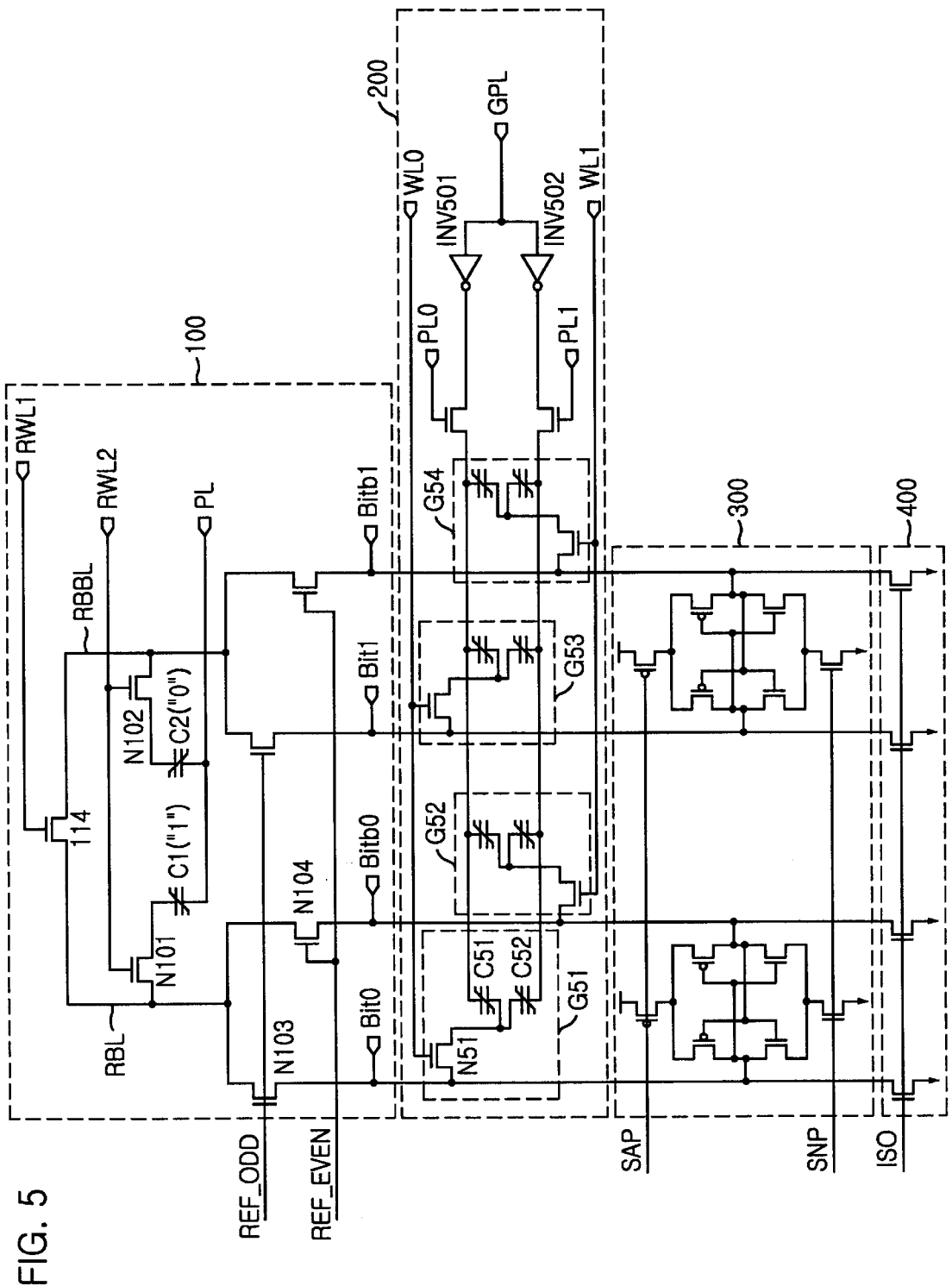
FIG. 5 presents a circuit diagram illustrating a reference voltage generator, a memory cell array, a sense amplifier and a precharge part of ferroelectric memory device in accordance with the present invention.

FIG. 5 is a circuit diagram illustrating a core part of the FeRAM in accordance with the present invention. As shown in FIG. 5, the FeRAM device according to the present invention includes a memory cell array 200, a reference voltage generator 100, a sense amplifier 300, and a precharge part 400. The reference voltage generator 100 generates a reference voltage, which is lager than the voltage corresponding to a logic data "0" and smaller than the voltage corresponding to a logic data "1", to bit lines in the memory cell array 200. The sense amplifier 300 senses and amplifies the data from the memory cell array 200 based on the reference voltage. The bit lines are precharged to the ground level by the precharge part 400 before the reading operation.

Figure 6:
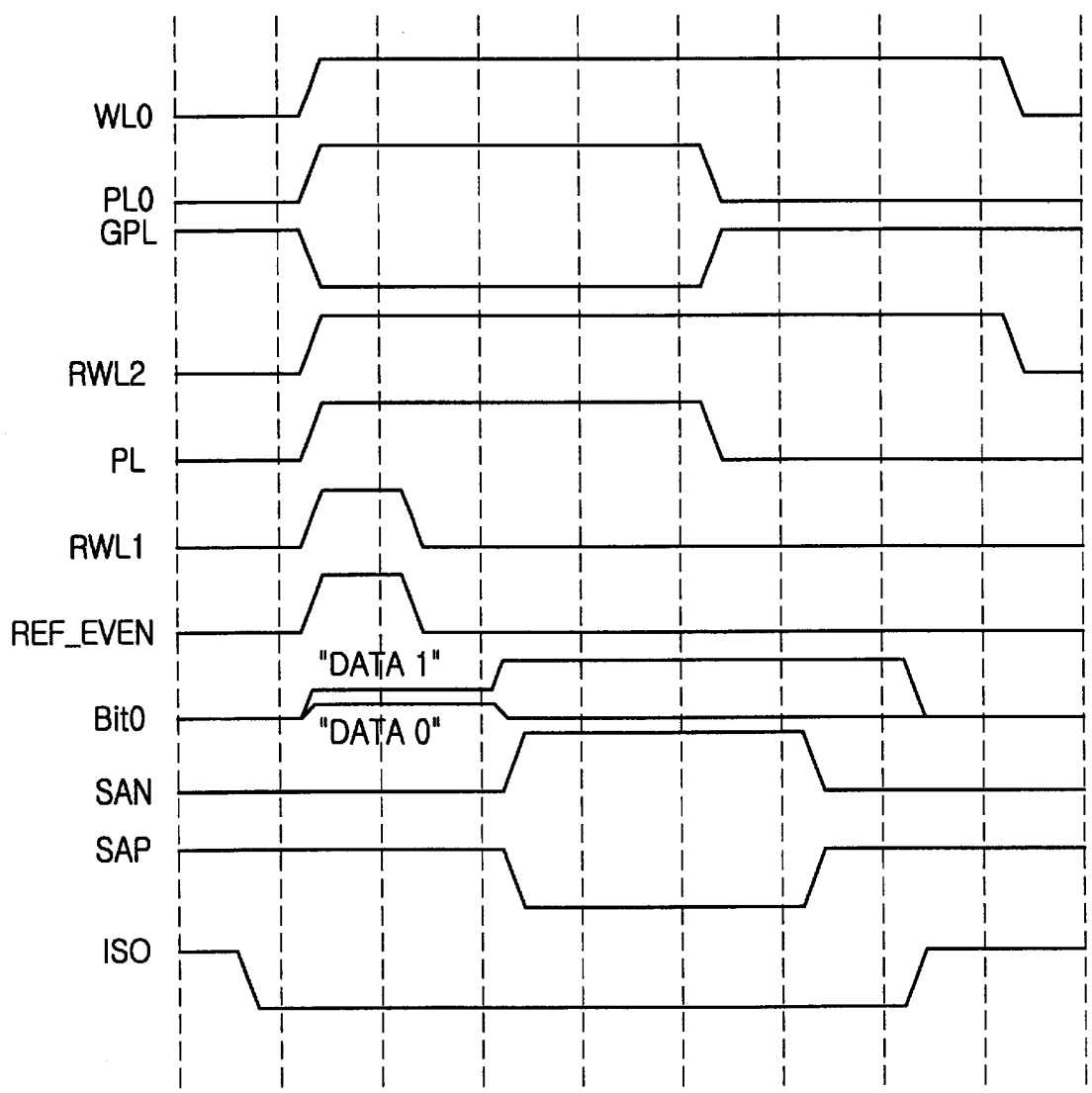
FIG. 6 shows timing diagram of the memory device shown in FIG. 5.

FIG. 6 is a timing diagram of the memory device shown in FIG. 5.

Referring to FIGS. 5 and 6, the operation for reading data stored in the ferroelectric capacitor C51 in a cell group G51 including two memory cells will be described in detail.

In a standby state, a bit line precharge signal ISO of bit line precharge part 400 is activated in a high voltage level, so that the bit line Bit0 and bit bar line Bitb0 are precharged to a ground level. Next, a bit line precharge signal ISO is activated in a low voltage level, so that the bit line Bit0 and bit bar line Bitb0 are precharged to 0V. A word line WL0 is activated to turn on a switching NMOS transistor N51, so that a voltage is applied to both terminal of the ferroelectric capacitor C51. In case where a low signal is applied to the global plate line GPL and a high level signal is applied to the plate line PL0 to select the capacitor C51, the charge stored in the ferroelectric capacitor C51 moves to the bit line Bit0, and the voltage of the bit line Bit0 is varied.

Next, the switching NMOS transistors N1 and N2 are activated to read out a logic data "1" or "0" stored in each ferroelectric capacitor C1 and C2. Then, a plate line control signal is applied to the plate line PL commonly coupled to the ferroelectric capacitors C1 and C2.

That is, the ferroelectric capacitors C1 and C2 contained in reference voltage generator 100 store a logic data "0" or "1", and the transistors N101 and N102 are turned on under the control of the activated word line RWL1. The reference bit bar line RBL and the reference bit bar line RBBL have charges induced by a ferroelectric capacitor C1 and a ferroelectric capacitor C2, respectively. After equalizing a reference bit line RBL with reference bit bar line RBBL, the equalized reference voltage is transferred to one bit line pair through transfer transistor N103 controlled by a control signal ref_add. At this time, the switching NMOS transistor N104 controlled by a control signal ref_even in the reference voltage generator 100 is turned on in order to select a bit bar line Bitb0 used as the reference voltage supply means. After changing the voltage of the bit line, a high voltage and a low voltage are respectively applied to control signal lines SAP and SNP in the sense amplifier 300. Data stored in the ferroelectric capacitor C51 can be read out by sensing and amplifying the voltage induced by the ferroelectric capacitor C51 and the reference voltage from the voltage generator 100.

Figure 7:
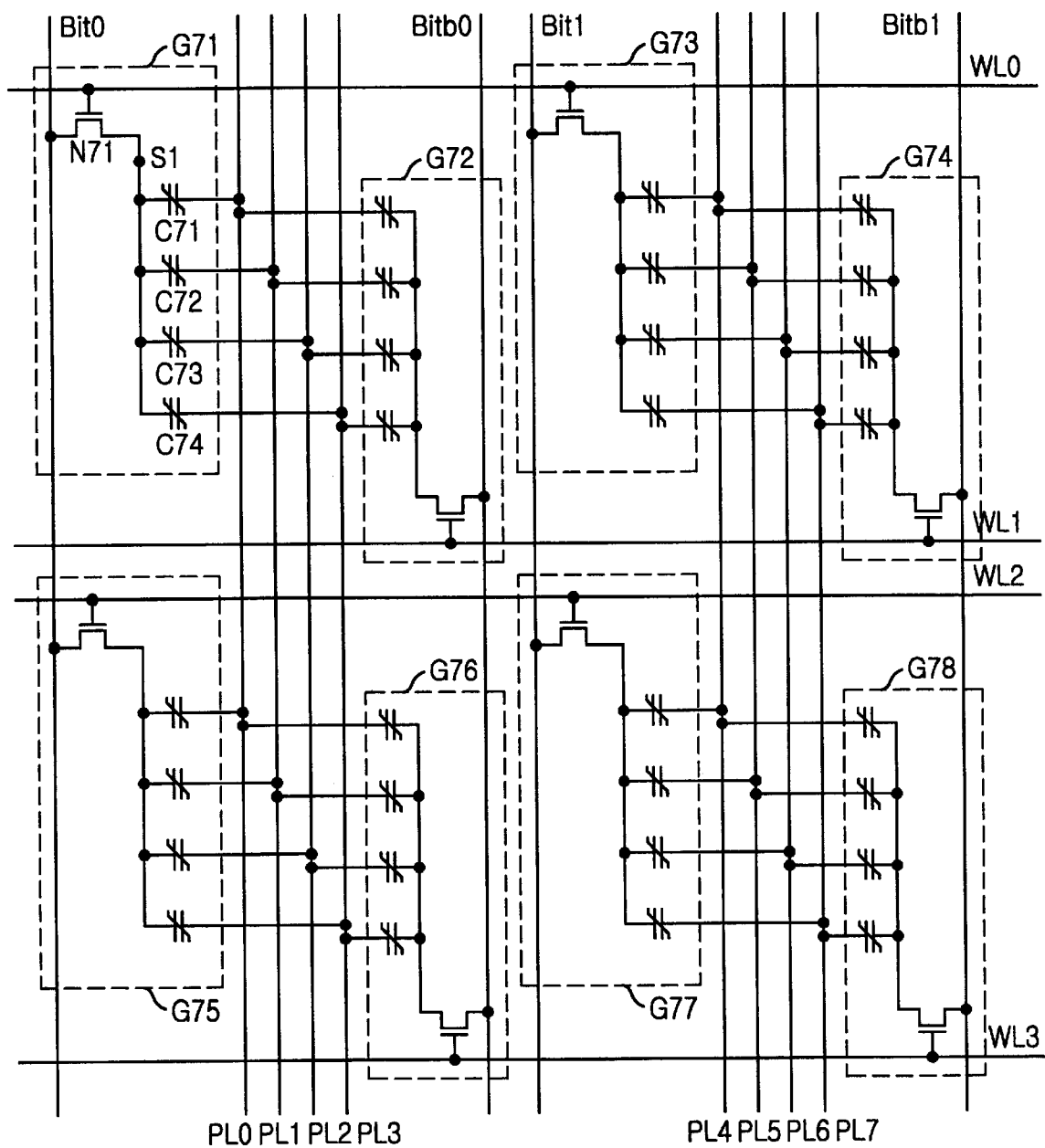
FIG. 7 presents a circuit diagram illustrating the cell array of a ferroelectric memory device in accordance with another embodiment of the present invention.

Referring to FIG. 7, a FeRAM according to another embodiment of the present invention includes a plurality of cell groups G71 to G78 having adjacent four memory cells coupled to the same bit line and the same word line. Each of ferroelectric capacitors C71 to C74 in the cell group G71 is commonly coupled to the same switching NMOS transistor N71 and respectively to the different plate lines PL0 to PL4.

A gate of the NMOS transistor N71 is coupled to a word line WL0. One source/drain junction of the NMOS transistor N71 is coupled to a bit line Bit0 and the other source/drain junction of the NMOS transistor N71 is coupled to the ferroelectric capacitors C71 to C74. A first electrode of the each ferroelectric capacitors C71 to C74 is commonly coupled to the NMOS transistor N71, and a second electrode of the each ferroelectric capacitors C71 to C74 is coupled to the different plate lines PL0 to PL4, respectively. Therefore, four memory cells in one cell group G71 includes one switching NMOS transistor N71 and four ferroelectric capacitors C71 to C74.

The word lines WL0 to WL3 are perpendicular to the plate lines PL0 to PL3 and parallel to the bit lines Bit0 to Bitb3. Each plate line is commonly coupled to ferroelectric capacitors in the different cell groups.

A read operation of the FeRAM device will be described in detail with reference to FIG. 7.

In order to read data, stored in the ferroelectric capacitor C71 of the cell group G71, the word line WL0 connected to the NMOS transistor N71 is selected and activated and the rest word lines WL1–WL3 are remained as inactivated. And a high level signal, Vcc, is applied to the plate line PL0 coupled to the ferroelectric capacitor C71. Therefore, the voltage of the bit line Bit0 is changed by the variation of the polarization state of the ferroelectric capacitor C71 and the logic data "1" or "0" can be transmitted to the bit line Bit0. The data transmitted to the bit line Bit0 can be read out by the sensing and amplifying operation.

In order to read data stored in the ferroelectric capacitors C72 to C74, the world line and plate lines coupled to the ferroelectric capacitors C72 to C74 are respectively selected.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A ferroelectric memory device comprising:
   a plurality of memory cells, wherein each memory cell includes a ferroelectric capacitor for storing data;
   a reference voltage generating means for generating a reference voltage;
   a sense amplifying means for sensing and amplifying signals outputted from the memory cell;
   a precharging means;
   a plurality of bit line pairs precharged by the precharging means, wherein the bit line pairs are coupled to the reference voltage generating means and wherein each bit line pair includes a first bit line for transmitting cell data and the reference voltage to the sense amplifying means and the second bit line for transmitting the reference voltage to the sense amplifying means;
   a plurality of cell groups, wherein each cell group includes a plurality of memory cells which are commonly coupled to the same word line and the same bit line pair through one transistor; and
   a plurality of plate lines for respectively driving the ferroelectric capacitors contained in each memory cell of the same cell group.

2. The ferroelectric memory device as recited in claim 1, wherein the transistor has a gate coupled to the word line, a first source/drain junction coupled to the bit line, and a second source/drain junction commonly coupled to the first electrode of the ferroelectric capacitor in each memory cell.

3. The ferroelectric memory device as recited in claim 1, wherein each ferroelectric capacitor contained in each memory cell of the same cell group includes:
   a first electrode commonly coupled to the transistor;
   a ferroelectric layer; and
   a second electrode respectively coupled to different plate lines.

4. The ferroelectric memory device as recited in claim 1, wherein the word lines are arranged parallel to the plate lines and perpendicular to the bit lines.

5. The ferroelectric memory device as recited in claim 1, wherein the word lines are arranged perpendicular to the plate lines and the bit lines, respectively.

6. The ferroelectric memory device as recited in claim 1, wherein the plate lines are commonly coupled to ferroelectric capacitors contained in different cell groups.

7. The ferroelectric memory device as recited in claim 1, wherein the bit line pairs are discharged to a ground voltage level by the precharging means before a read operation.

* * * * *